US006458621B1

(12) United States Patent
Beck

(10) Patent No.: US 6,458,621 B1
(45) Date of Patent: Oct. 1, 2002

(54) BATCH FABRICATED MOLECULAR ELECTRONIC DEVICES WITH COST-EFFECTIVE LITHOGRAPHIC ELECTRODES

(75) Inventor: Patricia A. Beck, Palo Alto, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/920,994

(22) Filed: Aug. 1, 2001

(51) Int. Cl.[7] .................... H01L 21/00; H01L 51/40; G11C 11/00; G11C 13/00
(52) U.S. Cl. .................... 438/99; 438/1; 438/800; 365/151
(58) Field of Search .................... 438/99, 133, 800; 438/1; 365/151, 153, 158

(56) References Cited

U.S. PATENT DOCUMENTS

| | | | | |
|---|---|---|---|---|
| 3,975,623 A | * | 8/1976 | Weinberger | 326/38 |
| 4,208,728 A | * | 6/1980 | Blahut et al. | 326/108 |
| 5,475,341 A | * | 12/1995 | Reed | 257/40 |
| 5,519,629 A | * | 5/1996 | Snider | 326/38 |
| 5,589,692 A | * | 12/1996 | Reed | 257/23 |
| 5,640,343 A | * | 6/1997 | Gallagher et al. | 365/171 |
| 5,790,771 A | * | 8/1998 | Culbertson et al. | 714/3 |
| 6,128,214 A | | 10/2000 | Kuekes | 365/151 |
| 6,198,655 B1 | | 3/2001 | Heath | 365/151 |

OTHER PUBLICATIONS

U.S. Ser. No. 09/280,048, pending application entitled "Chemically Synthesized and Assembled Electronic Devices", filed Mar. 29, 1999.
U.S. Ser. No. 09/280,225, pending application entitled "Molecular Wire Crossbar Interconnect (MWCI)", filed Mar. 29, 1999.
U.S. Ser. No. 09/280,045, pending application entitled "Molecular Wire Crossbar Logic (MWCL)", filed Mar. 29, 1999.
U.S. Ser. No. 09/280,188, pending application entitled "Molecular Wire Transistor (MWT)", filed Mar. 29, 1999.
U.S. Ser. No. 09/823,195, pending application entitled "Bistable Molecular Mechanical Devices With a Band Gap Change Activated by an Electric Field for Electronic Switching, Gating, and Memory Applications", filed Mar. 29, 1999.
C.P. Collier et al, "Electronically Configurable Molecular–Based Logic Gates", Science, vol. 285, pp. 391–394 (Jul. 16, 1999).
C.P. Collier et al, "A [2]Catenane–Based Solid State Electronically Reconfigurable Switch", Science, vol. 289, pp. 1172–1175 (Aug. 18, 2000).
U.S. Ser. No. 09/895,601, pending application entitled "Fabrication of Molecular Electronic Circuits by Imprinting", filed Jun. 28, 2001.
R.E. Howard et al, "Multilevel Resist For Lithography below 100 Nanometers", Transactions on Electron Devices, vol. ED–28, No. 11, pp. 1378–1381 (Nov. 1981).

* cited by examiner

Primary Examiner—John F. Niebling
Assistant Examiner—Walter L. Lindsay, Jr.

(57) ABSTRACT

An improved method of fabricating nanometer-scale devices is provided, wherein the improvement comprises: (1) employing materials for a first electrode, a first insulating layer, if present, a molecular switch layer, a second insulating layer, if present, and a second electrode that permit photopatterning of the second electrode; and (2) photopatterning at least the second electrode without adversely affecting the molecular switch layer. The improved method incorporates known techniques on a smaller scale than previously done to provide a means to move away from shadow mask electrodes (many micrometers wide), presently used in nanometer-scale devices, and move to nanometer dimensions. The improved method further facilitates integration of nanometer-scale devices to larger silicon-based technology.

19 Claims, 2 Drawing Sheets

US 6,458,621 B1

BATCH FABRICATED MOLECULAR ELECTRONIC DEVICES WITH COST-EFFECTIVE LITHOGRAPHIC ELECTRODES

CROSS-REFERENCE TO RELATED APPLICATIONS

The present application is related to application Ser. No. 09/280,048, entitled "Chemically Synthesized and Assembled Electronic Devices", filed on Mar. 29, 1999, which is directed to the formation of nanowires used for nanoscale computing and memory circuits. The present application is also related to application Ser. No. 09/280,225, entitled "Molecular Wire Crossbar Interconnect (MWCI) for Signal Routing and Communications", Ser. No. 09/280,045, entitled "Molecular Wire Crossbar Logic (MWCL)", and Ser. No. 09/280,188, entitled "Molecular Wire Transistor (MWT)", all also filed on Mar. 29, 1999, and to U.S. Pat. No. 6,128,214, entitled "Molecular Wire Crossbar Memory", issued on Oct. 3, 2000, which are all directed to various aspects of memory and logic circuits utilized in nanocomputing. The present application is also related to application Ser. No. 09/823,195, filed Mar. 29, 2001. The foregoing references are all incorporated herein by reference.

TECHNICAL FIELD

The present application is generally directed to nanoscale computing and memory circuits, and, more particularly, to the formation of wires for device applications, specifically, to the fabrication of electrodes employed in such devices. By "nanoscale" is meant that either the horizontal or vertical dimensions or the electrical pathway between electrodes is measured in nanometers.

BACKGROUND ART

With the constantly decreasing feature sizes of integrated-circuit devices, well-behaved devices are becoming increasingly difficult to design. The fabrication is also becoming increasingly difficult and expensive. In addition, the number of electrons either accessed or utilized within a device is decreasing, with increasing statistical fluctuations in the electrical properties. In the limit, device operation depends on a single electron, and traditional device concepts must change.

Molecular electronics has the potential to augment or even replace conventional devices with electronic elements, can be altered by externally applied voltages, and have the potential to scale from micron-size dimensions to nanometer-scale dimensions with little change in the device concept. The molecular switching elements can be formed by inexpensive solution techniques; see, e.g., C. P. Collier et al, "Electronically Configurable Molecular-Based Logic Gates", *Science,* Vol. 285, pp. 391–394 (Jul. 16, 1999) and C. P. Collier et al, "A [2]Catenane-Based Solid State Electronically Reconfigurable Switch", *Science,* Vol. 289, pp. 1172–1175 (Aug. 18, 2000). The self-assembled switching elements may be integrated on top of a Si integrated circuit so that they can be driven by conventional Si electronics in the underlying substrate. To address the switching elements, interconnections or wires are used.

For nanoscale electronic circuits, it is necessary to invent new materials with the functions envisioned for them and new processes to fabricate them. Nanoscale molecules with special functions can be used as basic elements for nanoscale computing and memory applications.

While self-assembled techniques may be employed and while redox reaction-based molecules may be used, such as rotaxanes, pseudo-rotaxanes, and catenanes, other techniques for assembling the devices and other molecular systems may be employed. An example of such other techniques comprises lithographic techniques adapted to feature sizes in the micrometer-size range, as well as feature sizes in the nanometer-size range. An example of other molecular systems involves electric field induced band gap changes, such as disclosed and claimed in patent application Ser. No. 09/823,195, filed Mar. 29, 2001, which is incorporated herein by reference. Examples of molecules used in the E-field induced band gap change approach include molecules that evidence:

(1) molecular conformation change or an isomerization;

(2) change of extended conjugation via chemical bonding change to change the band gap; or (3) molecular folding or stretching.

Changing of extended conjugation via chemical bonding change to change the band gap may be accomplished in one of the following ways:

(a) charge separation or recombination accompanied by increasing or decreasing band localization; or (b) change of extended conjugation via charge separation or recombination and π-bond breaking or formation.

Molecular electronic devices, comprising crossed wire switches, hold promise for future electronic and computational devices. Thin single or multiple atomic layers can be formed, for example, by Langmuir-Blodgett techniques or self-assembled monolayer on a specific site. A very controlled roughness of the underlying surface is needed to allow optimal LB film formation. A crossed wire switch may comprise two wires, or electrodes, for example, with a molecular switching species between the two electrodes.

A common approach at present to forming one or both of the electrodes in nanoscale devices is the use of shadow masking. However, as is well-known, the resulting feature sizes are quite large, and are unsuitable for sub-micrometer- and nanometer-size devices. Further, edge definition is inherently poor, and the process is not scalable to smaller dimensions.

Thus, a process for defining electrodes is needed that avoids the problems associated with shadow masking and that is scalable to sub-micrometer and nanometer dimensions and provides good edge definition.

DISCLOSURE OF INVENTION

In accordance with the present invention, an improved method of fabricating nanometer-scale devices is provided. The method comprises:

(a) providing a substrate having a major surface;

(b) forming a first electrode on the major surface of the substrate;

(c) optionally forming a first insulating layer on a major surface of the first electrode;

(d) forming a layer of a molecular switch material on either the major surface of the first electrode or a major surface of the first insulating layer, if present;

(e) optionally forming a second insulating layer on a major surface of the molecular switch layer; and (f) forming a layer of a second electrode on a major surface of the molecular switch layer or a major surface of the second insulating layer, if present. The improvement comprises:

(1) employing materials for the first electrode, the first insulating layer, if present, the molecular switch layer, the second insulating layer, if present, and the second electrode that permit photopatterning of the second electrode; and (2) photopatterning at least the second electrode without adversely affecting the molecular switch layer.

The method of the present invention incorporates known techniques on a smaller scale than previously implemented to provide a way to move away from shadow mask electrodes (many micrometers wide), presently used in nanometer-scale devices, and move to nanometer dimensions. Further, the method of the present invention provides a means to make devices in keeping with conventional device fabrication procedures, for possible future integration with additional circuitry. Finally, the method of the present invention can ensure that there is no additional barrier in the final device structure. For example, one must be very careful to remove any oxide or other contaminants such as resist residue from the lower metal before applying the upper metal if there are two depositions of metal. If there are contaminants or oxide, then another barrier is formed and the device having the structure substrate-electrode-molecule-electrode (S-E-M-E) would instead have the structure substrate-electrode-molecule-electrode-insulator-electode (S-E-M-E-I-E). An extra layer at the surface is of no concern, for probes and bonds will penetrate the layer, but a buried layer will change device characteristics.

BEST MODES FOR CARRYING OUT THE INVENTION

Definitions

Figure 1A:
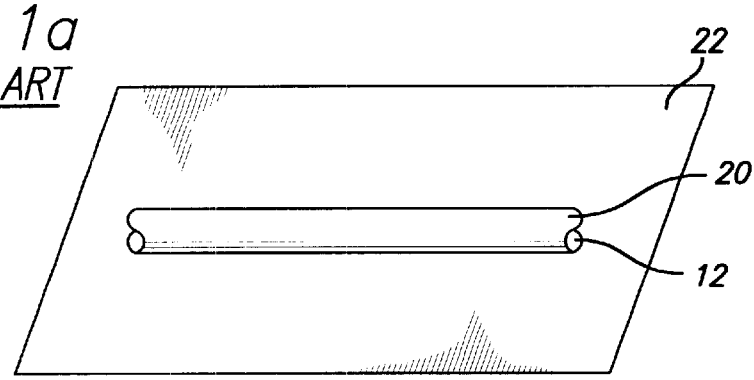
FIGS. 1a–1c are a schematic representation of the steps that use chemically fabricated (nanometer-scale diameter) wires to form a crossed wire switch.

As used herein, the term "self-aligned" as applied to "junction" means that the junction that forms the switch and/or other electrical connection between two wires is created wherever two wires, either of which may be coated or functionalized, cross each other, because it is the act of crossing that creates the junction.

The term "self-assembled" as used herein refers to a system that naturally adopts some regular pattern because of the identity of the components of the system; the system achieves at least a local minimum in its energy by adopting this configuration.

The term "singly configurable" means that a switch can change its state only once via an irreversible process such as an oxidation or reduction reaction; such a switch can be the basis of a programmable read-only memory (PROM), for example.

The term "reconfigurable" means that a switch can change its state multiple times via a reversible process such as an oxidation or reduction; in other words, the switch can be opened and closed multiple times, such as the memory bits in a random access memory (RAM).

The term "bi-stable" as applied to a molecule means a molecule having two relatively low energy states. The molecule may be either irreversibly switched from one state to the other (singly configurable) or reversibly switched from one state to the other (reconfigurable).

"Micron-scale dimensions" refers to dimensions that range from 1 micrometer to a few micrometers in size.

"Sub-micron scale dimensions" refers to dimensions that range from 1 micrometer down to 0.05 micrometers.

"Nanometer scale dimensions" refers to dimensions that range from 0.1 nanometers to 50 nanometers (0.05 micrometers).

"Micron-scale wires" refers to rod or ribbon-shaped conductors or semiconductors with widths or diameters having the dimensions of 1 to 10 micrometers or larger, heights that can range from a few tens of nanometers to a few micrometers, and lengths of up to several micrometers or more.

"Nanometer-scale wires" refers to rod or ribbon-shaped conductors or semiconductors with widths or diameters having the dimension of 1 to 50 nanometers, heights that can range from 0.3 to 100 nm, and lengths of up to several micrometers or more.

Crossed Wire Switches

The description which follows is directed to the formation of micrometer scale and nanometer scale crossed wire switches, using either a reduction-oxidation (redox) reaction to form an electrochemical cell or using electric field (E-field) induced band gap changes to form molecular switches. In either case, the molecular switches typically have two states, and may be either irreversibly switched from a first state to a second state or reversibly switched from a first state to a second state. In the latter case, there are two possible conditions: (1) either the electric field may be removed after switching into a given state, and the molecule will remain in that state ("latched") until a reverse field is applied to switch the molecule back to its previous state, or (2) removal of the electric field would cause the molecule to revert to its previous state, and hence the field must be maintained in order to keep the molecule in the switched state until it is desired to switch the molecule to its previous state.

The crossed wire switch based on the redox reaction approach is disclosed and claimed in the above-identified patent application Ser. No. 09/280,048. Examples of molecules used in the redox reaction approach include rotaxanes, pseudo-rotaxanes, catenanes, and spiropyrans.

The crossed wire switch based on the E-field induced band gap change is disclosed and claimed in patent application Ser. No. 09/823,195, filed Mar. 29, 2001. Examples of molecules used in the E-field induced band gap change approach include molecules that evidence:

(1) molecular conformation change or an isomerization;

(2) change of extended conjugation via chemical bonding change to change the band gap; or (3) molecular folding or stretching.

Changing of extended conjugation via chemical bonding change to change the band gap may be accomplished in one of the following ways:

(a) charge separation or recombination accompanied by increasing or decreasing band localization; or (b) change of extended conjugation via charge separation or recombination and π-bond breaking or formation.

Figure 1B:
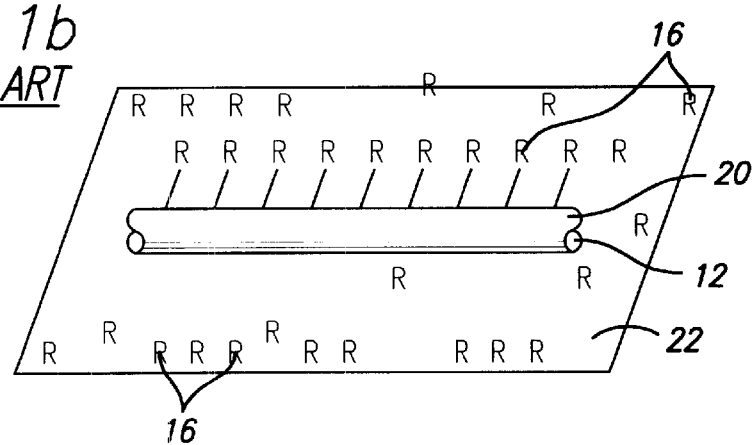
Figure 1C:
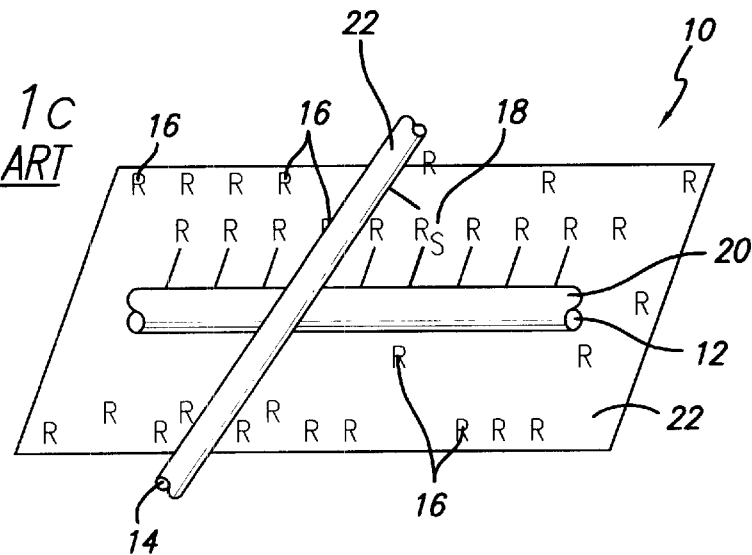

Although the description of FIGS. 1a–1c is presented in terms of the redox reaction approach, it will be readily apparent to those skilled in this art that the teachings of the present invention are equally applicable to the E-field induced band gap change approach.

The essential device features of a crossed wire switch 10 are shown in FIG. 1c. The crossed wire switch 10 comprises two wires, or electrodes, 12, 14, each either a metal or semiconductor wire, that are crossed at some non-zero angle. In between those wires is a layer of molecules or molecular compounds 16, denoted R in FIGS. 1b–1c. The particular molecules 18 (denoted $R_s$) that are sandwiched at the intersection of the two wires 12, 14 are identified as switch molecules. When an appropriate voltage is applied across the wires, the switch molecules are either oxidized or reduced. When a molecule is oxidized (reduced), then a second species is reduced (oxidized) so that charge is balanced. These two species are then called a redox pair. One example of this device would be for one molecule to be reduced, and then a second (the other half of the redox pair) is oxidized. In another example, a molecule is reduced, and one of the wires is oxidized. In a third example, a molecule is oxidized, and one of the wires is reduced. In a fourth example, one wire is oxidized, and an oxide associated with the other wire is reduced. In all cases, oxidation or reduction will affect the tunneling distance or the tunneling barrier height between the two wires, thereby exponentially altering the rate of charge transport across the wire junction, and serving as the basis for a switch.

Devices 10 (micrometer scale or nanometer scale) made from redox pairs may be prepared according to the method depicted in FIGS. 1a–1c. In this case, a semiconductor (i.e., silicon) nanowire 12, possibly with an insulating surface layer 20 (for silicon, this is the naturally occurring $SiO_x$, where x=1–2) is deposited on a substrate 22, as illustrated in FIG. 1a. The substrate 22 is electrically insulating, and may comprise any of the substrate materials commonly employed in semiconductor fabrication, such as, but not limited to, undoped (i.e., intentionally not doped) semiconductor, silicon nitride, amorphous silicon dioxide (i.e., glass), crystalline silicon dioxide (i.e., quartz), sapphire, silicon carbide, diamond-like carbon (DLC), and the like, either in bulk form (the entire substrate) or in film form (film grown or deposited on a semiconductor substrate, such as silicon, gallium arsenide, etc.).

Second, a redox pair of molecules 16 (labeled R in FIG. 1b) is transferred as either a Langmuir-Blodgett film, or via some other form of deposition such as vacuum sublimation. The redox pair 16 can cover both the wire 12 and the substrate 22 or only the wire 12.

In the last step, either a metal or a semiconductor wire 14, possibly with an insulating layer (not shown), is deposited across the first wire 12. Only those redox pairs 18 that are sandwiched between the two wires 12, 14 are defined, or can function, as molecular switches 10, as illustrated in FIG. 1c.

Figure 2A:
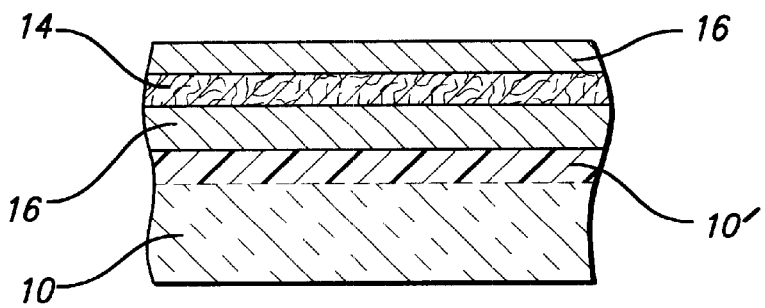
FIGS. 2a–2d are cross-sectional view that illustrate various configurations of devices comprising a molecular species sandwiched between two electrodes, supported on a substrate.
Figure 2B:
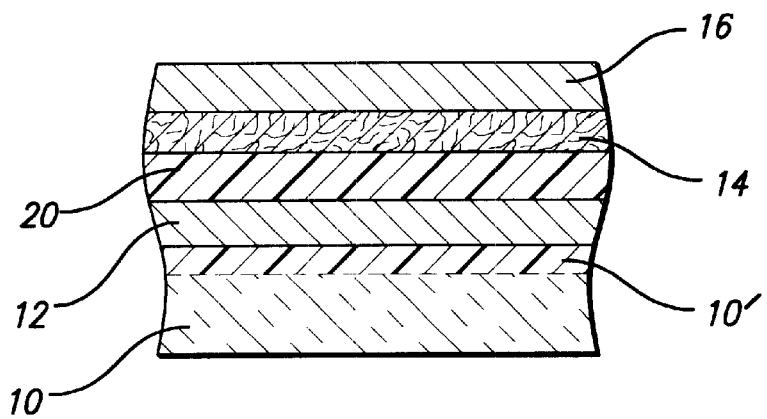
Figure 2C:
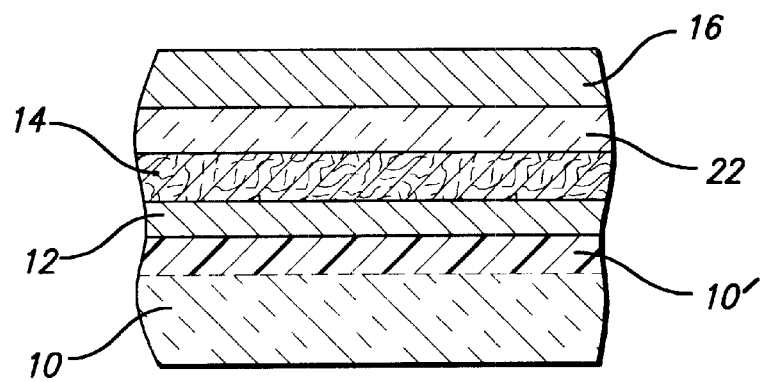
Figure 2D:
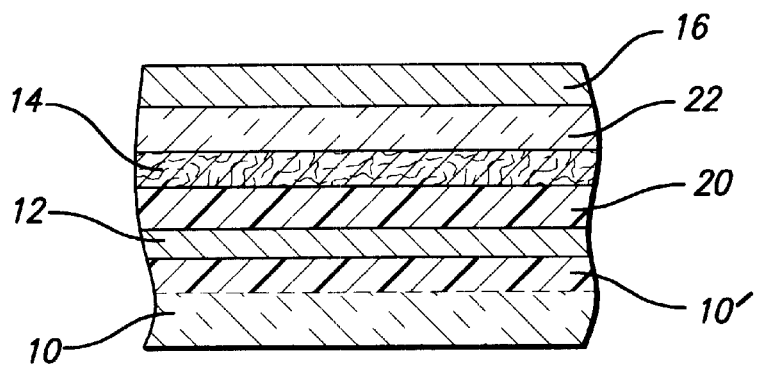

There are four basic device structures that may be employed in the practice of the present invention; these are listed below, along with a reference to the Figure that depicts that structure. The basic device structures are as follows (S=substrate 22; $E_L$=lower electrode 12; M=molecule 16; $E_U$=upper electrode 14; I=insulator 20, 24):

| (1) | S-$E_L$-M-$E_U$ | FIG. 2a |
| (2) | S-$E_L$-I-M-$E_U$ | FIG. 2b |
| (3) | S-$E_L$-M-I-$E_U$ | FIG. 2c |
| (4) | S-$E_L$-I-M-I-$E_U$ | FIG. 2d. |

The substrate 22, lower electrode 12, molecule 16, and upper electrode 14 are essential in a nanoscale device of the type contemplated herein. The two insulator layers 20 and 24 are optional, and one or the other or both may be employed in device structures. The substrate 22 may include an insulating layer 22' thereon. It will be appreciated by those skilled in this art that a ground plane (not shown) can be present on the backside of the substrate 22 or buried within the substrate.

The substrate 22 may comprise any of the common materials employed as insulating substrate materials, including, but not limited to, semiconductor, insulating plastic, polymer, ceramic (crystalline or amorphous), etc.

Preferably, a flat silicon substrate is employed, on which is grown thermal silicon dioxide. Most preferably, the silicon dioxide comprises a first thin dry oxide region, a second thick wet oxide region, and a third thin dry oxide region. The dry oxide is grown at a slow rate and is dense, while the wet oxide is grown at a faster rate and is less dense. The thickness of the thermally-grown $SiO_2$ is about 1,000 to 5,000 Å, although the maximum thickness could be on the order of 1 micrometer. The specific details of depositing thermally-grown $SiO_2$ is well-known in semiconductor processing.

On the substrate 22 is formed an array of the lower electrodes 12. The lower electrodes 12 may comprise any of the common materials employed as electrically-conducting electrode materials, including, but not limited to, semiconductor, metal, conducting polymers, etc. If semiconductors are used for both the substrate 22 and the lower electrodes 12, it will be appreciated that two different semiconductors are employed and that the electrical conductivity of the lower electrodes is sufficiently higher than that of the substrate to separate the functions of insulating (substrate) and conducting (lower electrode). Alternatively, and preferably, an insulating oxide layer 22' (shown in phantom) may be formed on the surface of the substrate 22.

If the lower electrode 12 is metal, such as platinum, tungsten, or aluminum, it may be formed by sputtering or evaporation. If the lower electrode is silicon, preferably polycrystalline silicon ("polysilicon"), then it may be deposited employing conventional silicon deposition procedures, such as low pressure chemical vapor deposition utilizing SiH4. Single crystal silicon or amorphous silicon may alternatively be used. Also alternatively, electrically conducting polymers may be used; such polymers are well-known.

The thickness of the first electrode 12 is on the order of 500 to 1,000 Å, although the electrode could be thicker, if desired. A thicker electrode 12 is preferred if it is to serve as an etch stop (discussed below), with the caveat that care must be taken with respect to an appropriate cross-sectional profile.

The lower electrodes 12 may be patterned, in whole or in part, by any number of lithographic techniques, such as, but not limited to, UV lithography and X-ray lithography, and direct patterning, such as, but not limited to, electron beam, laser ablation, focused ion beam (FIB; additive or subtractive), laser-assisted deposition, electron-assisted deposition, photo-assisted deposition, and AFM/STM-assisted deposition. Alternatively, nano-imprinting may be employed. Nano-imprinting is disclosed and claimed in application Ser. No. 09/895,601, filed on Jun. 28, 2001 [PD-10017384-1], entitled "Fabrication of Molecular Electronic Circuits by Imprinting", by Yong Chen. Also alternatively, electroplating may be employed. Either lift-off or etching (wet or dry) can be used in the patterning process, both of which are well-known procedures in semiconductor processing. Examples of dry etching include ion-milling and reactive ion etching (RIE).

If a barrier, or insulator, layer 20 is desired and is not formed as an inherent part of the electrode (such as the native oxide of $Al_2O_3$ on Al), it may be added at this point. If a native oxide is employed, then exposure of the lower electrodes 12 to air for a period of time, usually some fraction of an hour, is sufficient. If a thicker insulator layer 20 is desired, then any of the common oxide formation or deposition techniques well-known in semiconductor fabrication may be employed. For example, if the lower electrode is silicon, then thermal oxidation, for example, may be employed to form $SiO_2$. Alternatively, in such a case, silicon nitride, silicon oxynitride, silicon carbide, or a diamond-like carbon (e.g., 100% $sp^3$-bonded diamond-like carbon) may be formed. Further, insulating oxides, nitrides, and carbides may be deposited such as by chemical vapor deposition, including low pressure CVD and plasma-enhanced CVD, or sputtering from a target.

The molecular film 16 is next formed on either the insulator layer 20 or on the lower electrode 12 (if no insulator layer is used). The molecular film 16 comprises a material that evidences switching behavior upon application of an electric field. The switching may be reversible or irreversible, and may or may not require an electric field to maintain the molecule in a switched state. All such types of molecular switching compounds may be employed in the practice of the present invention.

A number of suitable organic molecules have been disclosed, based on their switching properties, such as rotaxanes, pseudo-rotaxanes, and catenanes, which involve oxidation/reduction (redox) mechanisms for switching; see, e.g., U.S. Pat. No. 6,128,214, "Molecular Wire Crossbar Memory", issued on Oct. 3, 2000, to Philip J. Kuekes et al (rotaxanes, pseudorotaxanes, catenanes); and U.S. Pat. No. 6,198,655, "Electrically Addressable Volatile Non-Volatile Molecular-Based Switching Devices", issued on Mar. 6, 2001, to J. R. Heath et al ([2]catenanes).

Alternatively, electric field switchable molecules that do not rely on redox reactions but rather on electric field-induced band gap changes may be used in the practice of the present invention; see, e.g., above-mentioned application Ser. No. 09/823,195.

The molecular film 16 is conveniently applied by Langmuir-Blodgett, Langmuir-Schaeffer, vapor deposition, or other suitable film-forming technique.

If a barrier, or insulator, layer 24 is desired, it may be added at this point. The material comprising layer 24 may be the same or different than the material comprising layer 20.

The upper electrodes 14 are next formed on either the insulator layer 24 or on the molecular layer 16 (if no insulator layer is used). A "sticking layer" (not shown) may be optionally used to better adhere the upper electrode layer 14 to the underlying layer (insulator 24 or molecular layer 16). Such sticking layers are well-known in semiconductor processing, and include titanium, tantalum, chromium, nickel, and vanadium, for example.

The upper electrodes 14 are selected from the same group of electrically-conducting materials as the lower electrodes 12, and may be the same or different. Deposition and patterning of the upper electrodes 14 may use the same procedures mentioned above with regard to the lower electrodes 12.

Examples of metals preferably employed as the upper electrodes 14 include Ti—Al, Ti—Pt, W, and Ti—W. In many instances, the upper electrode 14 must be selected in combination with the lower electrode 12, since, in some cases, it may be required to etch through the upper electrode down to the bottom electrode. In such cases, it must be possible to etch one without etching the other, either by selecting a bottom electrode 12 that etches at a slower rate than the top electrode 14 or by providing a bottom electrode having a greater thickness than the top electrode so that etching the top electrode does not unduly limit the conducting path of the bottom electrode.

The upper electrodes 14 are patterned employing any of the same techniques as disclosed above for the bottom electrodes 12. However, it will be appreciated that the same technique need not be used for patterning both sets of electrodes 12 and 14. It will also be appreciated that the patterns of both lower electrodes 12 and upper electrodes 14 may be complex, depending on the design of the specific circuit intended.

It is the last two steps (deposition of insulator layer 24 and formation of upper electrodes 14) that are particularly critical in the fabrication of nano-scale devices. Many organic molecules are disturbed by direct contact with solvents, such as those used to develop photoresists, although these tests have been performed with exposed sheets of organic molecules, not taking into account barrier layers on top as might be formed with an electrode process. Nevertheless, it is still reason for concern. It has been speculated that the developers associated with various resists may not in fact attack masked molecules with small exposed cross sections, once covered with a masking material. (While the developer is assumed to attack the surface of an exposed sheet of the organic molecule, a resist developer may not be able to effectively move laterally between the upper mask and the lower electrode, a distance in some cases of only 30 Å, to attack the organic molecule of interest. This means that resist may not have to be kept completely out of contact with the molecule.)

Compared to the upper electrode 14, the lower electrode 12 may employ a wider variety of materials as well as a wider variety of photopatternable steps used in the manufacturing of electronic devices which need connecting traces (not shown).

To form a photo-patterned upper electrode 14, one may also use techniques employed in other areas of device fabrication, with the additional burden of preserving a molecular film 16, which may be organic in nature.

EXAMPLES

In the examples described below, a flat silicon substrate, provided with a thermally-grown $SiO_2$ layer, is used. As is conventional, the oxide layer is a combination of a thin dry oxide on the substrate, followed by a thick wet oxide, and capped with a thin dry oxide. The thin dry oxide is grown at a slow rate, resulting in a dense film. The thick wet oxide is grown at a faster rate. The thermally-grown $SiO_2$ is formed to a total thickness of about 1,000 to 2,000 Å.

The lower electrode comprises platinum, about 1,000 Å thick, and is formed by sputtering onto a patterned resist. Lift off of the resist removes unwanted portions of the platinum layer, leaving patterned platinum behind. Appropriate residue removal is performed to ensure proper adhesion and no extraneous insulating material in the electrode stack.

The molecular layer comprises a rotaxane. Examples of rotaxanes have been disclosed elsewhere; see, e.g., above-mentioned U.S. Pat. No. 6,128,214. Alternatively, the molecular layer comprises an E-field induced band gap change material, as disclosed and claimed in above-mentioned Ser. No. 09/823,195.

The lower and upper insulators, if used, are $Al_2O_3$. $Al_2O_3$ can be formed either by reacting Al in oxygen during deposition or by completely oxidizing a thin deposited layer of aluminum. In the latter case, a 12 Å film of aluminum oxidizes to an approximately 16 Å layer of alumina, for example. Alternatively, a diamond-like carbon layer may be used.

The top electrode is variously Ti—Pt, Ti—W, W, Cr—Al, Ti—Cr—Al, Ti—W—Cr—Al, Ti—W—Al, or Ti—Al, as noted below, where titanium or chromium, if used, serve as an adhering layer for the metal to the layer below, as well as a differential etch layer in some cases.

It will be appreciated that patterning of the top electrode, and concomitant patterning of lower layers, if desired, depends upon the selection of the bottom electrode and top electrode materials and of the lower and upper insulating layers, as well as the processes used in the patterning. A combination of differential etchants and/or layer thicknesses may be employed. Etch stop layers as employed herein are not necessarily hard etch stops (although they are not precluded), but rather typically rely on the differential etch rate such that it is relatively easy to stop the etch at a desired layer.

Example 1a
No Insulator Layers: Si—$SiO_2$—Pt-Molecule-Ti—Pt

The following structure (1) is fabricated, in which no insulator layers are needed:

| Substrate | Bottom Electrode | Insulator | Molecule | Insulator | Top Electrode |
|---|---|---|---|---|---|
| Si—$SiO_2$ | Pt | — | rotaxane | — | Ti—Pt |

The bottom electrode is first formed, followed by deposition of the rotaxane. The top electrode is then deposited directly on the molecular layer.

In forming the top electrode, a resist layer is formed on the platinum layer (there is no break in the deposition of titanium and platinum, so there is no oxide formation between Ti and Pt) and patterned. Ion milling is used to cut through the platinum and titanium layers, through the rotaxane, and down to the lower electrode. The junction is protected even if there is an over-etch. The only requirement in this configuration is that the bottom platinum electrode be thicker than the top platinum electrode so as to ensure complete etching of the top electrode. An additional $O_2$ plasma ash could be used to remove any resist that might remain after etching.

Example 1b
No Insulator Layers: Si—$SiO_2$—Pt-Molecule-Ti—W or Si—$SiO_2$—Pt-Molecule-W The following structure (1) is fabricated, in which no insulator layers are needed:

| Substrate | Bottom Electrode | Insulator | Molecule | Insulator | Top Electrode |
|---|---|---|---|---|---|
| Si—$SiO_2$ | Pt | — | rotaxane | — | Ti—W; W |

The bottom electrode is first formed, followed by deposition of the rotaxane. The top electrode (Ti—W or W) is then deposited directly on the molecular layer.

In forming the top electrode, a resist layer is formed on the tungsten layer and patterned. Reactive ion etching (RIE), employing a $CF_4$-containing plasma, preferably $CF_4/O_2$, is used to cut through the tungsten layer, through the titanium layer (if present), through the rotaxane, and down to lower electrode. The junction is protected even if there is over etch, since platinum serves to stop the etching. Any remaining resist is removed by an $O_2$ ash.

Alternatively, RIE is used to cut through the tungsten layer, and, since the RIE process is slowed by titanium, then ion-milling can be employed. Because the titanium layer is thin (about 50 Å), this layer is milled quickly and milling continues down through the molecular layer to the bottom electrode, where it is stopped, employing, for example, visual determination.

Example 1c
No Insulator Layers: Si—$SiO_2$—Pt-Molecule-Cr—Al or Si—$SiO_2$—Pt-Molecule-Ti—Cr—Al or Si—$SiO_2$—Pt-Molecule-Ti—W—Cr—Al The following structure (1) is fabricated, in which no insulator layers are needed:

| Substrate | Bottom Electrode | Insulator | Molecule | Insulator | Top Electrode |
|---|---|---|---|---|---|
| Si—$SiO_2$ | Pt | — | rotaxane | — | Cr—Al; Ti—Cr—Al; Ti—W—Cr—Al |

The bottom electrode is first formed, followed by deposition of the rotaxane. The top electrode (Cr—Al, Ti—Cr—Al, or Ti—W—Cr—Al) is then deposited directly on the molecular layer.

For Ti—Cr—Al, a resist is formed on the top layer (Al), which is then patterned. The exposed portions of aluminum are then etched (patterned), using Cl-based RIE. The resist may be stripped at this point or not, as desired. The chromium layer is deliberately thin, and acts to stop the RIE process. Exposed portions of the thin Cr layer are then ion-milled. At this point, there are a number of possible processes that may be used to complete the patterning process. In one process, the titanium and molecular layer may be ion-milled, down to the bottom electrode. In a second process, the ion-milling may be terminated (some titanium may be milled during complete removal of the exposed portions of the chromium) and the etching continued with a $CF_4$-containing plasma, preferably $CF_4/O_2$, down to the bottom electrode. In a third process, ion-milling may be used through the chromium and titanium layers, then switching to an $O_2$ plasma to remove the molecular layer (and any residual top resist).

For Ti—W—Cr—Al, the resist is formed and patterned as above, and the aluminum is etched as above. Again, the resist may be stripped at this point or not. The chromium is lightly ion-milled, stopping in the tungsten layer. The ion-milling is terminated, and the remaining etching, down to the bottom electrode, is performed with a $CF_4$-containing plasma, preferably $CF_4/O_2$, which forms a protective oxide on the aluminum.

For Cr—Al, the resist is formed and patterned as above, and the aluminum is etched as above. Again, the resist may be stripped at this point or not. The chromium is ion-milled, continuing down to the bottom electrode. Alternatively or additionally, after the chromium is removed, the etching may be continued with an $O_2$ plasma, as above.

Example 2
Lower Insulator Layer Required: Si—$SiO_2$—Pt-Oxide-Molecule-Cr—Al or Si—$SiO_2$—Pt-Oxide-Molecule-Ti—Cr—Al or Si—$SiO_2$—Pt-Oxide-Molecule-Ti—W—Cr—Al or Si—$SiO_2$—Pt-Oxide-Molecule-W The following structure (2) is fabricated, in which a lower insulator layer is needed:

| Substrate | Bottom Electrode | Insulator | Molecule | Insulator | Top Electrode |
|---|---|---|---|---|---|
| Si—SiO$_2$ | Pt | Al$_2$O$_3$ | rotaxane | — | Cr—Al; Ti—Cr—Al; Ti—W—Cr—Al; W |

The bottom electrode is first formed, followed by deposition of an insulator, specifically, aluminum oxide, thereon, and then the rotaxane on top of the oxide. The top electrode (Cr—Al, Ti—Cr—Al, Ti—W—Cr—Al, or W) is then deposited directly on the molecular layer.

For Ti—Cr—Al, the procedure outlined in Example 1c is used. It will be appreciated that the second and third processes will stop on Al$_2$O$_3$. If it is desired to etch through the alumina layer, then ion-milling can be used to extend the pattern down to the bottom electrode.

For Ti—W—Cr—Al, the procedure outlined in Examiner 1c is used. The CF$_4$-containing plasma will stop on the alumina layer. If it is desired to etch through that layer, then ion-milling can be used to extend the pattern down to the bottom electrode.

For Cr—Al, the procedure outlined in Example 1c is used. If an O$_2$ plasma is used, it will be appreciated that this process will stop on the alumina layer, as discussed above.

For W, the resist is formed and patterned as above. The tungsten is etched in a CF$_4$-containing plasma, preferably CF$_4$/O$_2$, down to alumina. Ion-milling may be used to extend the pattern down to the bottom electrode, if desired, as discussed above.

Example 3
Upper Insulator Layer Required: Si—SiO$_2$—Pt-Molecule-Oxide-Cr—Al or Si—SiO$_2$—Pt-Molecule-Oxide-Ti—Cr—Al or Si—SiO$_2$—Pt-Molecule-Oxide-Ti—W—Cr—Al or Si—SiO$_2$—Pt-Molecule-Oxide-W The following structure (3) is fabricated, in which an upper insulator layer is needed:

| Substrate | Bottom Electrode | Insulator | Molecule | Insulator | Top Electrode |
|---|---|---|---|---|---|
| Si—SiO$_2$ | Pt | — | rotaxane | Al$_2$O$_3$ | Cr—Al; Ti—Cr—Al; Ti—W—Cr—Al; W |

The bottom electrode is first formed, followed by deposition of the rotaxane, and then followed by deposition of an insulator, specifically, 30 Å of aluminum oxide, thereon. The top electrode (Cr—Al, Ti—Cr—Al, Ti—W—Cr—Al, W) is then deposited directly on the oxide.

For Ti—Cr—Al, Ti—W—Cr—Al, Cr—Al, and W, the respective procedures outlined in Example 2 are used. Noting that if the etch stops on Al$_2$O$_3$ and further etching is necessary, then ion-milling or a combination of ion-milling and O$_2$ plasma will etch down to the bottom electrode, as previously described.

Where a diamond-like carbon (DLC) is used in place of alumina, this 10 material is etched in an O$_2$, CF$_4$/O$_2$, or CF$_4$ plasma or is ion-milled.

Example 4
Both Insulator Layers Required: Si—SiO$_2$—Pt-Oxide-Molecule-Oxide-Cr—Al or SiO$_2$—Oxide-Molecule-Oxide-Ti—Cr—Al or Si—SiO$_2$-Oxide-Molecule-Oxide-Ti—W—Cr—Al or Si—SiO$_2$—Oxide-Molecule-Oxide-Cr—W or Si—SiO$_2$-Oxide-Molecule-Oxide-Ti—W The following structure (4) is fabricated, in which both insulator layers are needed:

| Substrate | Bottom Electrode | Insulator | Molecule | Insulator | Top Electrode |
|---|---|---|---|---|---|
| Si—SiO$_2$ | Pt | Al$_2$O$_3$ | rotaxane | Al$_2$O$_3$ | Cr—Al; Ti—Cr—Al; Ti—W—Cr—Al; Cr—W; Ti—W |

The bottom electrode is first formed, followed by deposition of an insulator, specifically, aluminum oxide, thereon, and then the rotaxane on top of the oxide, and then followed by deposition of an oxide, specifically, 50 Å of aluminum oxide, on the rotaxane. The top electrode (Cr—Al; Ti—Cr—Al; Ti—W—Cr—Al; Cr—W, Ti—W) is then deposited directly on the oxide.

For Ti—Cr—Al, Ti—W—Cr—Al, Cr—Al, and W, the respective procedures outlined in Example 2 are used. For Cr—W and Ti—W, the tungsten is etched as described in Example 2. The same considerations discussed in Example 1c for transferring the pattern through Cr and Ti, respectively, obtain here as well. The same considerations in Example 3 regarding etch stopping on Al$_2$O$_3$ obtain here as well. In the case of tungsten, when the tungsten etch stops or slows on Cr or Ti, one may continue to etch Ti in a CF$_4$/O$_2$ plasma or may switch to ion-milling for either Cr or Ti.

Where a diamond-like carbon (DLC) is used in place of alumina on either the bottom insulator, top insulator, or both, this material is etched in an O$_2$, CF$_4$/O$_2$, or CF$_4$ plasma or is ion-milled, as described in Example 3. In this case, if the top electrode is Ti—W, then the resist is formed and patterned as above. A CF$_4$-containing plasma, preferably CF$_4$—O$_2$, is used to etch down to the bottom electrode. If a thick (on the order of 3,000 Å) tungsten layer is used, one could form a Ti—W—Ti electrode, pattern the top titanium layer with photoresist, use a CF$_4$-containing plasma or ion-mill through the top titanium, and stop in the tungsten layer. The photoresist can be removed or left. The pattern-transfer process through the tungsten to the lower titanium can be performed with a CF$_4$-containing plasma, preferably CF$_4$O$_2$, which etches titanium. An appropriate choice of relative titanium thickness (e.g., lower Ti=50 Å, upper Ti=600 Å) allows for complete tungsten etching with minimum upper titanium remaining. By the time etching is completed to the bottom electrode, the top Ti layer should be completely gone.

Additional Information

On top of any of the foregoing metal electrodes in the above-described examples, a trilevel resist may be used to form an upper fine line etch mask of an appropriate metal/semiconductor/polymer; see, e.g., R. E. Howard et al, "Multilevel Resist for Lithography below 100 Nanometers", *Transactions on Electron Devices*, Vol. ED-28, No. 11, pp. 1378–1381 (November 1981).

As an example, the electrode and trilevel resist structure may comprise Ti—Al/polymer[P(MMA/MAA)]/Ge/e-beam resist (PMMA), where "P(MMA/MAA)" is a copolymer of methyl methacrylate and methacrylic acid and where "PMMA" is poly(methyl methacrylate). The electron-beam resist is used to pattern the germanium layer. The exposed portions of Ge are removed in a CF$_4$-containing plasma to expose portions of the polymer layer. An $O_2$ plasma removes exposed portions of the polymer layer and transfers the Ge pattern down through the polymer layer to the Al layer. A chromium layer is next blanket-deposited, and extraneous metal is lifted off by dissolving the underlying polymer layer, leaving precise chromium patterns covering portions of the Ti—Al layer, serving as a mask. A Cl-based RIE etch can be used to etch aluminum and then titanium, down to the bottom electrode, if desired. Subsequent removal of the chromium layer, which has been thinned during the etching, may be removed by ion-milling.

Further, various combinations of etch stops may be used, such as hard masks in place of photoresist, Ti—W—Ti layers, oxide as etch stop for molybenum, etc. This is by no means an exhaustive list, and such etch stops are well-known in conventional semiconductor processing. It will be appreciated by those skilled in this art that wet etch steps may be substituted for the dry etch steps, depending on the dimensional requirements. Additionally, by inference, an intermediate conductive barrier layer could be employed by breaking up the deposition of the metal and an adhesion layer into parts, with a clean-up technique such as back-sputtering to remove contaminants or oxides before deposition of a second metal. Those skilled in the art of plasma processing will understand how to remove surface Cl contamination (as in the etching of Al), such as by physical removal means (e.g., rinsing or ion-milling) or by additional gas passivation.

Industrial Applicability

The method of employing photopatterning for the fabrication of electrodes for molecular electronic devices is expected to find use in nanoscale computing and memory circuits.

What is claimed is:

1. An improved method of fabricating nanometer-scale devices, comprising:
    (a) providing a substrate having a major surface;
    (b) forming a first electrode on said major surface of said substrate;
    (c) optionally forming a first insulating layer on a major surface of said first electrode;
    (d) forming a layer of a molecular switch material on either said major surface of said first electrode or a major surface of said first insulating layer, if present;
    (e) optionally forming a second insulating layer on a major surface of said molecular switch layer; and
    (f) forming a layer of a second electrode on a major surface of said molecular switch layer or a major surface of said second insulating layer, if present, wherein the improvement comprises:
        (1) employing materials for said first electrode, said first insulating layer, if present, said molecular switch layer, said second insulating layer, if present, and said second electrode that permit photopatterning of said second electrode; and
        (2) photopatterning at least said second electrode without adversely affecting said molecular switch layer.
2. The method of claim 1 wherein said substrate comprises a material selected from the group consisting of semiconductors, insulating plastics, polymers, crystalline ceramics, and amorphous ceramics.
3. The method of claim 2 wherein said substrate comprises an insulating layer formed on a semiconductor wafer.
4. The method of claim 3 wherein said substrate comprises a layer of silicon dioxide formed on a silicon wafer.

5. The method of claim 1 wherein said first electrode comprises a material selected from the group consisting of platinum, tungsten, aluminum, polycrystalline silicon, single crystal silicon, and amorphous silicon, and conductive polymers.
6. The method of claim 5 wherein said first electrode is patterned by a process selected from the group consisting of UV lithography, X-ray lithography, electron beam lithography, ion-milling, laser ablation, focused ion beam patterning, laser-assisted deposition, electron-assisted deposition, photo-assisted deposition, AFM/STM-assisted deposition, nano-imprinting, and electroplating, employing either lift-off or etching.
7. The method of claim 1 wherein said first insulating layer is present and comprises a material selected from the group consisting of insulating oxides, nitrides, oxy-nitrides, carbides, and diamond-like carbons.
8. The method of claim 7 wherein said first insulating layer comprises a material selected from the group consisting of aluminum oxide, silicon dioxide, silicon nitride, silicon oxy-nitride, silicon carbide, and 100% $sp^3$-bonded diamond-like carbon.
9. The method of claim 1 wherein said molecular switch material involves an oxidation/reduction mechanism and is selected from the group consisting of rotaxanes, pseudo-rotaxanes, catenanes, and spiropyrans.
10. The method of claim 1 wherein said molecular switch material evidences an electric field induced band gap change and is selected from the group consisting of:
    (1) molecular conformation change or an isomerization;
    (2) change of extended conjugation via chemical bonding change to change the band gap; and
    (3) molecular folding or stretching, wherein said change of extended conjugation via chemical bonding change to change the band gap is selected from the group consisting of:
        (2a) charge separation or recombination accompanied by increasing or decreasing band localization; and
        (2b) change of extended conjugation via charge separation or recombination and $\pi$-bond breaking or formation.
11. The method of claim 1 wherein said second insulating layer is present and comprises a material selected from the group consisting of insulating oxides, nitrides, oxy-nitrides, carbides, and diamond-like carbons.
12. The method of claim 11 wherein said second insulating layer comprises a material selected from the group consisting of aluminum oxide, silicon dioxide, silicon nitride, silicon oxy-nitride, silicon carbide, and 100% $sp^3$-bonded diamond-like carbon.
13. The method of claim 1 wherein second electrode comprises a material selected from the group consisting of platinum, tungsten, aluminum, polycrystalline silicon, amorphous silicon and conductive polymers.
14. The method of claim 13 wherein said second electrode is patterned by a process selected from the group consisting of UV lithography, X-ray lithography, electron beam lithography, ion-milling, laser ablation, focused ion beam patterning, laser-assisted deposition, electron-assisted deposition, photo-assisted deposition, AFM/STM-assisted deposition, nano-imprinting, and electroplating, employing either lift-off or etching.
15. The method of claim 1 wherein said device has a structure comprising, in order, substrate—first electrode—molecular switch material—second electrode.
16. The method of claim 1 wherein said device has a structure comprising, in order, substrate—first electrode—first insulator—molecular switch material—second electrode.

17. The method of claim 1 wherein said device has a structure comprising, in order, substrate—first electrode—molecular switch material—second insulator—second electrode.

18. The method of claim 1 wherein said device has a structure comprising, in order, substrate—first electrode—first insulator—molecular switch material—second insulator—second electrode.

19. The method of claim 1 wherein both said first electrode and said second electrode are photopatterned.

* * * * *